United States Patent [19]
Jimbo et al.

[11] Patent Number: 5,517,421
[45] Date of Patent: May 14, 1996

[54] SYSTEM FOR MANAGING LSI DESIGN PART DATA

[75] Inventors: Yasuo Jimbo; Takahiro Shimizu; Yuichi Kintaka; Yuji Machiya, all of Tokyo, Japan

[73] Assignee: Dai Nippon Printing Co., Ltd., Tokyo, Japan

[21] Appl. No.: 137,096

[22] PCT Filed: Mar. 30, 1993

[86] PCT No.: PCT/JP93/00391

§ 371 Date: Oct. 21, 1993

§ 102(e) Date: Oct. 21, 1993

[30] Foreign Application Priority Data

| Mar. 31, 1992 | [JP] | Japan | 4-105741 |
| Mar. 31, 1992 | [JP] | Japan | 4-105742 |
| Mar. 31, 1992 | [JP] | Japan | 4-105743 |

[51] Int. Cl.⁶ .................................................. G06F 17/50
[52] U.S. Cl. ........................ 364/491; 364/488; 364/489; 364/490
[58] Field of Search .................... 364/489, 491, 364/468, 474.24, 474.25, 488, 490

[56] References Cited

U.S. PATENT DOCUMENTS

| 4,613,940 | 9/1986 | Shenton et al. | 364/491 |
| 4,703,435 | 10/1987 | Darringer et al. | 364/488 |
| 4,803,636 | 2/1989 | Nishiyama et al. | 364/491 |
| 4,922,432 | 5/1990 | Kobayashi et al. | 364/488 |
| 4,924,385 | 5/1990 | Dote | 364/468 |
| 4,964,056 | 10/1990 | Bekki et al. | 364/488 |
| 4,984,180 | 1/1991 | Wada et al. | 364/474.24 |
| 5,029,102 | 7/1991 | Drumm et al. | 364/489 |
| 5,031,111 | 7/1991 | Chao et al. | 364/491 |
| 5,050,091 | 9/1991 | Rubin | 364/490 |
| 5,212,650 | 5/1993 | Hooper et al. | 364/489 |
| 5,220,512 | 6/1993 | Watkins et al. | 364/489 |
| 5,267,175 | 11/1993 | Hooper | 364/489 |
| 5,274,793 | 12/1993 | Kuroda et al. | 364/489 |
| 5,345,393 | 9/1994 | Ueda | 364/489 |
| 5,367,468 | 11/1994 | Fukasawa et al. | 364/489 |
| 5,452,226 | 9/1995 | Hooper et al. | 364/489 |

FOREIGN PATENT DOCUMENTS

| 2-105975 | 4/1990 | Japan . |
| 2-202035 | 8/1990 | Japan . |
| 3-24749 | 2/1991 | Japan . |
| 4-152475 | 5/1992 | Japan . |
| 2241362 | 8/1991 | United Kingdom | G06F 15/60 |

OTHER PUBLICATIONS

Coleman and Counts, "Assembly Data Management", *Electronic Packaging & Production*, May 1991, pp. 72–74.

Primary Examiner—Kevin J. Teska
Assistant Examiner—Tyrone V. Walker
Attorney, Agent, or Firm—Ladas & Parry

[57] ABSTRACT

Databases are prepared for data of circuit parts to be used in designing ASICs. Each part data contains functional element indicative of kinds of devices and connection information of the devices, a characteristic element indicative of operational characteristic values for the devices, and structural element indicative of sizes and shapes of the devices and terminal positions of the devices. By extracting and synthesizing these elements, new part data can be generated. For example, elements are extracted from part data A by a process P1 and elements a1 to a3 are obtained, and elements are extracted from part data B by a process P2 and elements b1 to b3 are obtained. The elements a3, b2 are synthesized by a process P3, and new part data C is generated. The executed processes P1, P2, P3 are stored in a memory in addition to the part data A, B, C. When the part data A is revised, the stored processes P1, P3 are read to recognize the part data C needs the revising. The part data C is revised by using the process P3, and new part data is generated.

8 Claims, 7 Drawing Sheets

PART DATA A (LOGIC DESIGN PART DATA)

PART DATA B (CIRCUIT DESIGN PART DATA)

PART DATA C (LAYOUT DESIGN PART DATA)

FIG. 8

I. LAYOUT

```
      0    100   200  274
   0 ┬      VDD(10, 240)
     │ GND         □
     │ (12,12)
     │                 ◁
 100 ┤              ▷◁  A(66, 254)
     │              ◁   Y(96, 246)
     │                  B(124, 236)
 200 ┤
 252 ┴
```

II. SYMBOL

A o——⟩o—— Y
B o——

III. TRUTH TABLE

| A | B | Y |
|---|---|---|
| 0 | 0 | 1 |
| 0 | 1 | 1 |
| 1 | 0 | 1 |
| 1 | 1 | 0 |

IV. TvsC (GRAPH)

T (ns) vs C (pF), values 0.1, 0.3, 0.5, 0.7 on x-axis; 3, 6, 9 on y-axis.

V. TvsC (TABLE)

|   |   |   |   |   |   |   |   |
|---|---|---|---|---|---|---|---|
|   |   |   |   |   |   |   |   |
|   |   |   |   |   |   |   |   |
|   |   |   |   |   |   |   |   |
|   |   |   |   |   |   |   |   |
|   |   |   |   |   |   |   |   |
|   |   |   |   |   |   |   |   |

SYSTEM FOR MANAGING LSI DESIGN PART DATA

TECHNICAL FIELD

This invention relates to a system for managing LSI design part data, specifically to a device for generating and administering library data for CAD tools to be used in ASIC designs, and producing data sheets of the library data.

BACKGROUND ART

The design process for LSIs generally comprises the steps of function design, logic design, circuit design and layout design which are followed in the stated order. One design step is proceeded using design part data produced in its previous design step. Usually respective CAD tools are prepared to aid designs of the respective steps, and the designs are made based on the respective CAD tools. This completed design part data for LSIs are managed individually for the respective CAD tools.

Recently LSIs tend to have increasingly more applications, and the demand for the so called ASICs (Application Specific Integrated Circuit) has been increased. ASICs require relatively large scale circuits to be designed according to users' requirements in short periods of time. As a countermeasure to this, semiconductor device makers use a system in which they provide users libraries with a substantial amount of LSI design part data for respective CAD tools, and the tool users select required design part data out of the libraries and combine them to design their intended LSIs. In other words, semiconductor device makers keep a substantial amount of LSI design part data as what may be called parts, and users select data representing their required parts and combine the data into their intended LSIs.

LSI fabrication processes have made technical progress year by year, and efforts have been made to improve performance of integrated circuits and to further micronize the same. In accordance with performance improvements of integrated circuits, and micronization thereof, individual parts for the fabrication of ASICs, i.e,, LSI design part data, have to be revised. Newly improved CAD tools as well are available. To follow the latest CAD tools, it is necessary to revise LSI design part data to be provided in libraries.

As mentioned above, it is necessary that libraries of LSI design part data are prepared for the respective design steps and for respective CAD tools. In addition, plural design part data are interrelated with one another, and operations of revising the design part data are very complicated. A latest version is based on revising old design part data, and since users do not always use design part data of the latest version, it is necessary to keep plural versions of design part data. Besides, each design part data has a large amount of information. The management of design part data is accordingly very complicated and difficult.

On the other hand, when users make ASIC designs, they want information as to respective parts. Semiconductor device makers provide users with various information as to respective parts in a data sheet or a data book which is a collection of data sheets. With reference to provided data sheets, users are informed as to functions, characteristics, structures, etc. of respective parts, from which to make their intended ASIC designs.

But there are a number of parts to be used in ASIC designs, and users are provided with data books having large amounts of information. Users have to do cumbersome work to obtain information they require. Further, all data they require are not always contained in data books. For example, circuit characteristic values (setup times, hold times, etc.) contained in data books generally include safety margins for operating associated parts. When users require more precise characteristic values to design ASIC, they cannot obtain their essential information from the data books. On the other hand, semiconductor makers have to modernize their data books every time design part data are revised, and have to distribute them to users.

DISCLOSURE OF INVENTION

A first object of this invention is to provide a system for managing LSI design part data, which can easily generate and revise LSI design part data.

A second object of this invention is to provide a system for managing LSI design part data, which capable of producing data sheets of information a user requires relative to respective parts.

A third object of this invention is to provide a system for managing LSI design part data, which can easily revise data libraries to be used with CAD tools for various LSI designs.

To achieve the objects described above, the system for managing LSI design part data according to this invention is characterized as follows.

1) To achieve the first object of this invention, the system for managing LSI design part data to be used in LSI design having a first characteristic of this invention comprises:

element extracting means for extracting, from a selected part data, a specific element included in the selected part data;

part synthesizing means for synthesizing elements included in a selected part data or elements read from an outside source to generate a new part data;

part data storing means for storing the synthesized new part data;

process data storing means for storing a process for extraction by the element extracting means and a process for synthesis by the part synthesizing means; and input means for reading data or a command to the element extracting means and the part synthesizing means.

A characteristic of the system according to this invention is that processes for an extraction by the element extracting means, and a synthesis by the part synthesizing means are stored as process data. That is, information of what element is extracted out of part data and how , and how and into what part elements are extracted is stored as process data. When revised, the stored process data can provide information as to how the revision will influence part data. In addition, based on the process data, other part data can be easily revised. That is, large amounts of LSI design part data can be easily generated and managed.

2) To achieve the second object of this invention, the system for managing LSI design part data having a second characteristic of this invention comprises:

storing means for storing part data of respective parts as databases;

element extracting means for extracting, from a selected part data, a specific element included in the selected part data;

sheet generating means for editing data of an element extracted by the element extracting means, based on set information, whereby to generate sheet information;

sheet producing means for producing a data sheet, based on the sheet information; and input means for reading in the element extracting means element designating information for identifying elements to be extracted, reading element editing information for identifying editing to be conducted by the sheet information generating means, and format setting information for identifying a format for the sheet information to be formed.

In this system, when a user describes specific information identifying data the user requires, the element extracting means extract from data bases only elements the user requires. Subsequently the sheet information generating means edits the extracted element data, and provides the user with the data he requires on data sheets in a format he desires.

3) To achieve the third object of this invention, the system for managing LSI design part data having a third characteristic of this invention comprises:

element extracting means for extracting, from a selected part data, a specific element included in the selected part data;

part synthesizing means for synthesizing elements included in a selected part data or elements read from an outside source to generate new part data;

part data storing means for storing the synthesized new part data;

process storing means for storing a process for an extraction by the element extracting means and a process for a synthesis by the part synthesizing means;

data retrieving means for retrieving specific data from data in the part data memory means, based on a retrieval command supplied from the outside;

format converting means for converting a format for said specific data retrieved by the data retrieving means into a suitable format for a CAD tool; and input means for reading data or a command to the element extracting means, the part synthesizing means and the data retrieving means.

In this system the data retrieving means retrieves data which a CAD tool requires, based on a retrieval command which is a user's input. The data are prepared in a common format which is independent of specific CAD tools, and to be supplied to each CAD tool wherein the data are converted into a format suitable for the CAD tool by the format coverting means. Accordingly it is possible that part data can be simply managed.

4) A fourth characteristic of this invention is that in the above described system, there is provided representation converting means for converting a representation of an element included in the selected part data to generate a different element, a process for the representation conversion by the representation converting means being stored in the process data memory means.

BRIEF DESCRIPTION OF THE DRAWINGS

FIG. 8 is an example of data sheets produced by the system of FIG. 1.

BEST MODE FOR CARRYING OUT THE INVENTION

§1. General Structure of the System

Figure 1:
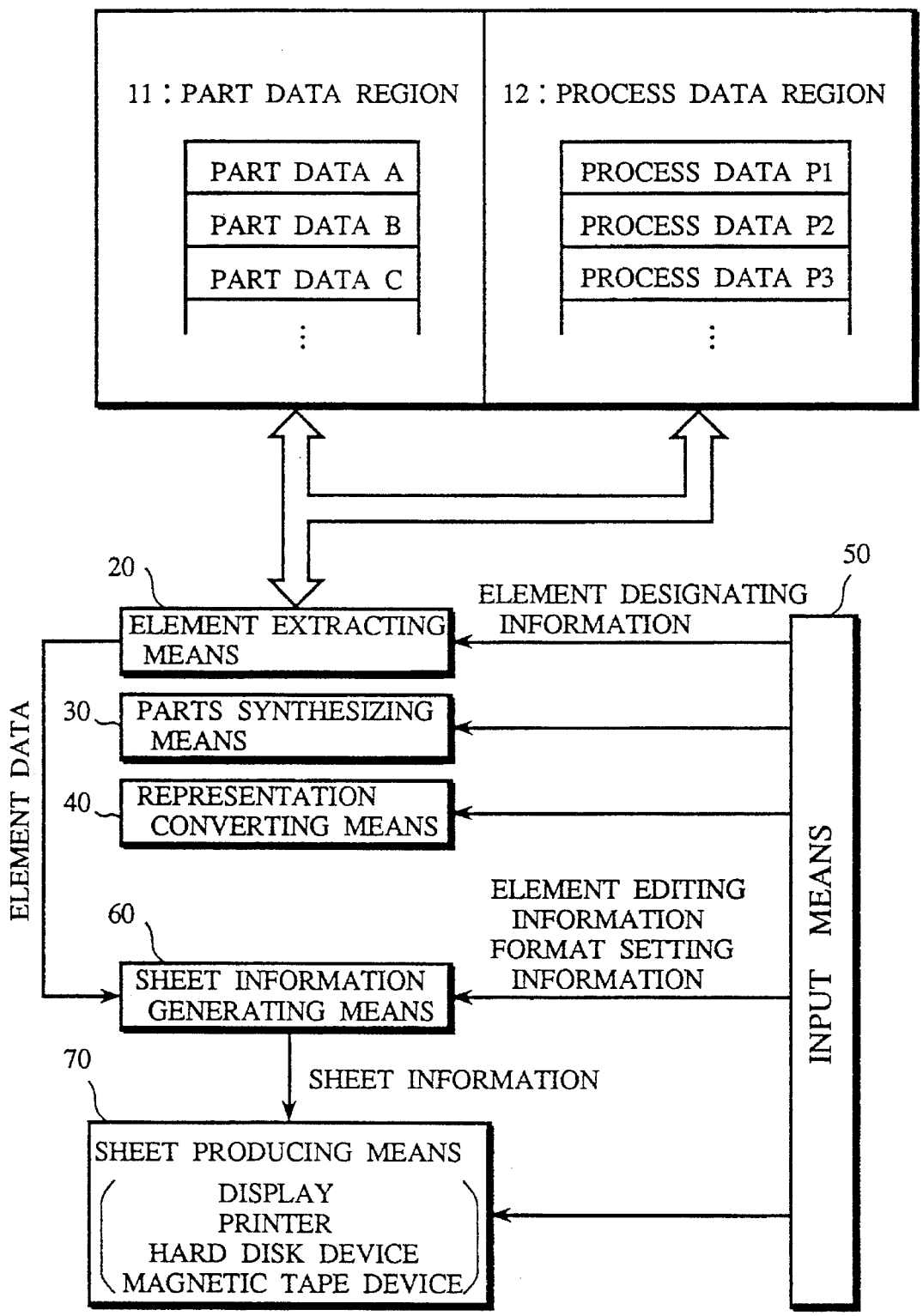
FIG. 1 is a block diagram of a basic structure of the system for managing LSI design part data according to this invention.

FIG. 1 is a block diagram showing a basic structure of a system for managing LSI design part data according to one embodiment of this invention. The system comprises memory means 10, element extracting means 20, parts synthesizing means 30, representation converting means 40, input means 50, sheet information producing means 60, and sheet producing means 70. These constituent members are provided by computers, its software, and its peripheral units. That is, the element extracting means 20, the parts synthesizing means 30, the representation converting means 40 and the sheet information producing means 60 are provided by a computer itself which operates on set programs, and the memory means 10 is provided by an outside memory device connected to the computer. The input means is provided by peripheral units, such as a keyboard, a mouse, etc., connected to the computer. The sheet output means 70 is provided by peripheral units connected to the computer, such as a display, a printer, a hard disk device, a magnetic tape device, etc. LSI design parts data are stored as databases in a part data region in the storing means 10. This system has features of generating new LSI design part data based on the data bases, and revising the LSI design part data.

§2. LSI Design Parts Data

Figure 2:
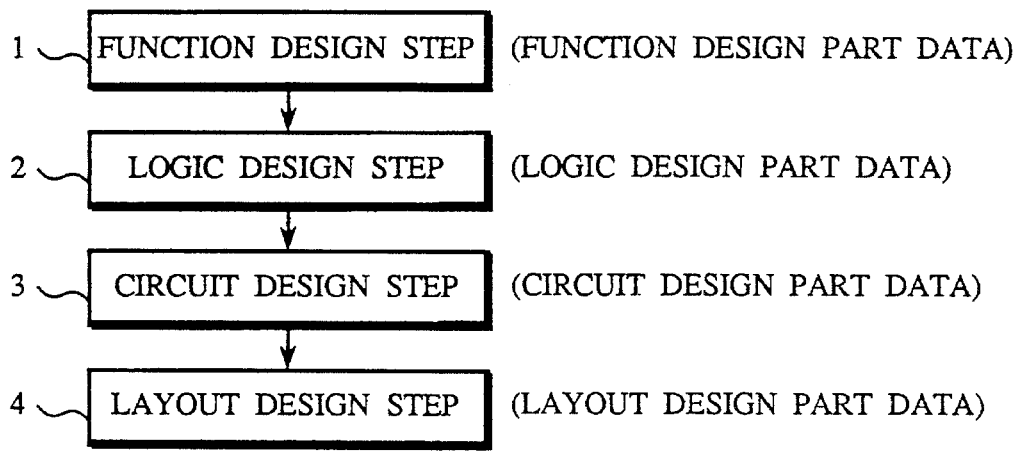
FIG. 2 is a view of respective steps of the general LSI design operation.

Before the operation of the device is explained, LSI design part data prepared as databases will be briefly explained. FIG. 2 is a view of respective steps of the general LSI design. In the function design step 1, an LSI to be designed is represented by a combination of some functional blocks. In the next logic design step, each functional block is represented by a combination of some logic devices (AND gates, OR gates, inverters, etc.). In the circuit design step 3, each logic device is represented by a circuit diagram of a combination of transistors, resistors, capacitors, etc. In the layout design step 4, mask patterns corresponding to the respective devices in the circuit diagram are designed. Generally designs in the respective steps are conducted using their associated CAD tools. The respective CAD tools include design part data required in the respective design steps. That is, function design part data are prepared for the function design step 1, logic design part data are prepared for the logic design step 2, circuit design part data are prepared for the circuit design step 3, and layout design part data are prepared for the layout design step 4.

Figure 3:
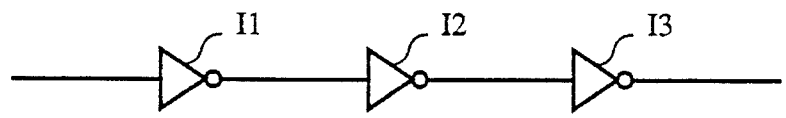
FIG. 3 is an example of the general LSI design part data.
Figure 3:
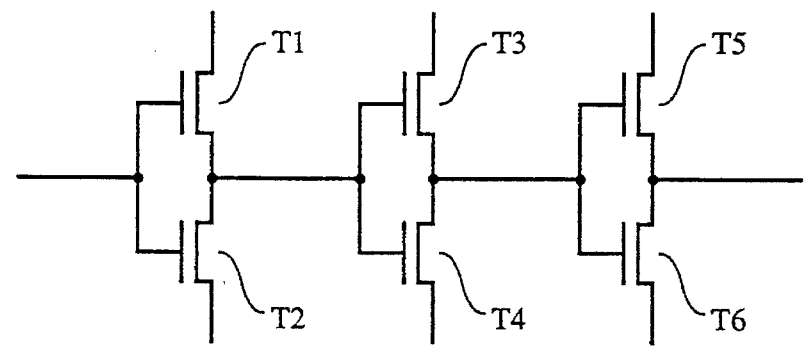
Figure 3:
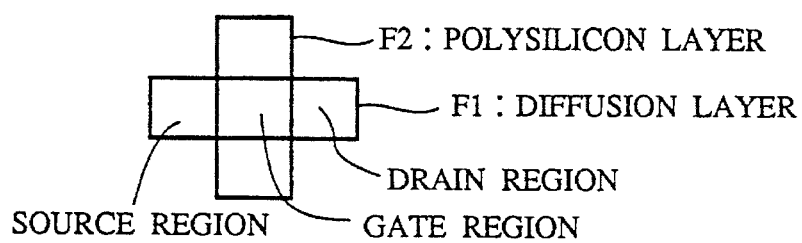

FIG. 3 shows some examples of such design part data. Part data A is a part data to be used in the logic design step 2. In this example, three inverters I1, I2, I3 are serially connected to form one part. Actually there are a number of other parts. One of them comprises, for example, only one inverter, and another of them comprises logic devices, such as AND gates, OR gates, etc., or a combination of these devices. Even if two parts comprise the same logic devices, they might be different parts depending on the characteristics and sizes of the logic devices. For example, the part data A comprises, in terms of function, three serially connected inverters and has operational characteristics (e.g., a delay time from a signal input to a signal output) and a size (an area which the part data A occupies in a semiconductor chip) also preset. Thus, even a part having the same function "comprising three serially connected inverters" is a different part from the part data A if the former has a different delay time and occupied area. In this invention, "part data" means data containing functional information (in the part data A, the information that three inverters I1, I2, I3 are serially connected), characteristic information (information of delay times and other electrical characteristics), and structural information (information of sizes, shapes, positions of input and output terminals, etc.).

Part data B is data to be used in the circuit design step 3. In this example, the part data B comprises devices each including two parallelly connected transistors, these devices being serially connected in three stages. The part data B corresponds to the part data A. As parts to be used in the circuit design step 3, a number of parts including, in addition to such transistors, resistors and capacitors are prepared. The part data B contains, in addition to the functional information that six transistors T1 to T6 are connected as shown, characteristic information and structural information as to the respective transistors. Part data C is part data to be used in the layout design step 4. In this example, the part data C comprises a mask pattern in the shape of a cross of a diffusion layer F1 and a polysilicon layer F2. The part data C as well contains, in addition to the functional information that the mask pattern comprises the cross of the diffusion layer F1 and the polysilicon layer F2, characteristic information (conductivities in respective layers, etc.) and structural information (areas of the respective layers).

§3. Interrelationships among LSI Design Part Data

To fabricate ASICs it is necessary to make relatively large scale circuit designs according to respective users' requirements. To this end semiconductor device makers have to provide users with large amounts of LSI part data for respective CAD tools as libraries. That is, it is necessary to prepare large amounts of part data for the respective steps 1 to 4 of FIG. 1. Furthermore, large amounts of part data are interrelated with one another, and generally one part data is generated by synthesizing an element included in a different part data and an element externally added.

Figure 4:
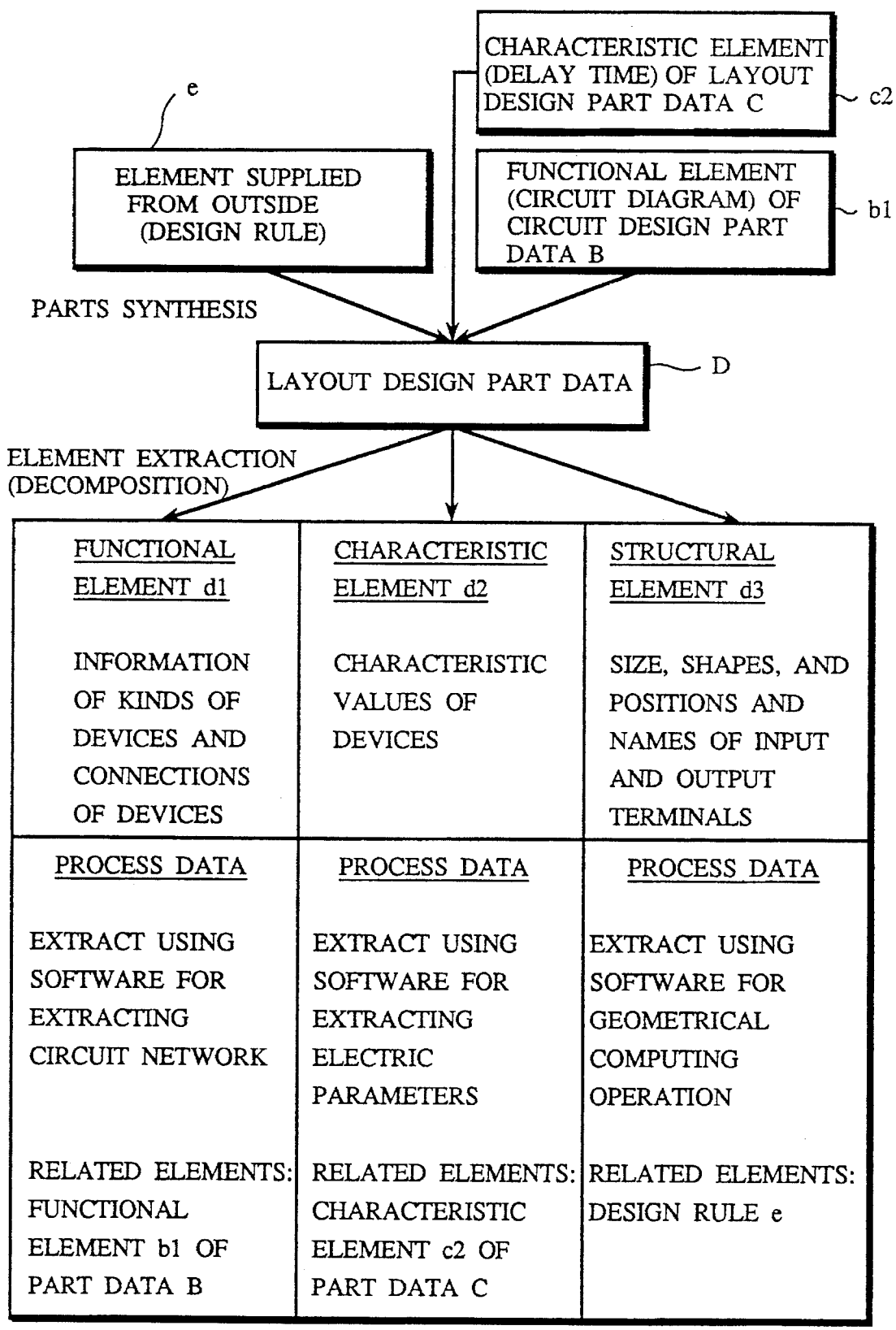
FIG. 4 is a view of one example of element extraction of LSI design part data, and parts syntheses.

Interrelationships among the part data will be briefly explained with reference to FIG. 4. As described above, one part data includes various information, and specific information alone can be extracted as one element. Generally functional elements, characteristic elements and structural elements can be extracted from LSI design part data. The element extraction will be explained with reference to the element extraction from, e.g., the layout design part data D as shown in FIG. 4. As shown in FIG. 3, layout data used in the layout design such as the part data C is a representation of parts of an LSI in a combination of geometrical figures. In the example of FIG. 4, from the layout design part data D, information indicating types of devices and connection of devices is extracted as functional element d1, characteristic values of devices are extracted as characteristic element d2, and sizes, shapes of respective geometrical figures, positions and names of output and input terminals are extracted as structural element d3. In other words, information included in the layout design part data D is decomposed into three elements of functional element d1, characteristic element d2 and structural element d3.

When the generating process of the layout design part data D is considered, in the example of FIG. 4, the elements e, b1 and c2 are synthesized to generate the part data D. The element b1 is a functional element (specifically a circuit diagram) obtained by breaking down the part data B, the element c2 is a characteristic element (specifically a delay time) obtained by breaking down the part data C, and the element e includes design rules added from the outside (structural element: for example, gaps between wiring layers). In short, the layout design part data D is data generated by synthesizing the functional element b1, the characteristic element c2 and the externally added structural element e.

The interrelationships among the part data will be further explained with reference to an example. For example, in order to generate a circuit design part data corresponding to the part data A (logic design part data) in FIG. 3, the respective inverters are constructed by two transistors, thus to generate the part data B. In this case, the part data B is a part data synthesized using the functional element a1 (i.e., the information that the inverters are serially connected in three stages) included in the part data A. To generate the layout design part data D corresponding to the part data B, the functional element b1 included in the part data B (i.e., the circuit diagram indicating that pairs of transistors are serially connected in three stages), a characteristic element c2 included in the part data C, and the design rule e externally given are synthesized.

Figure 5:
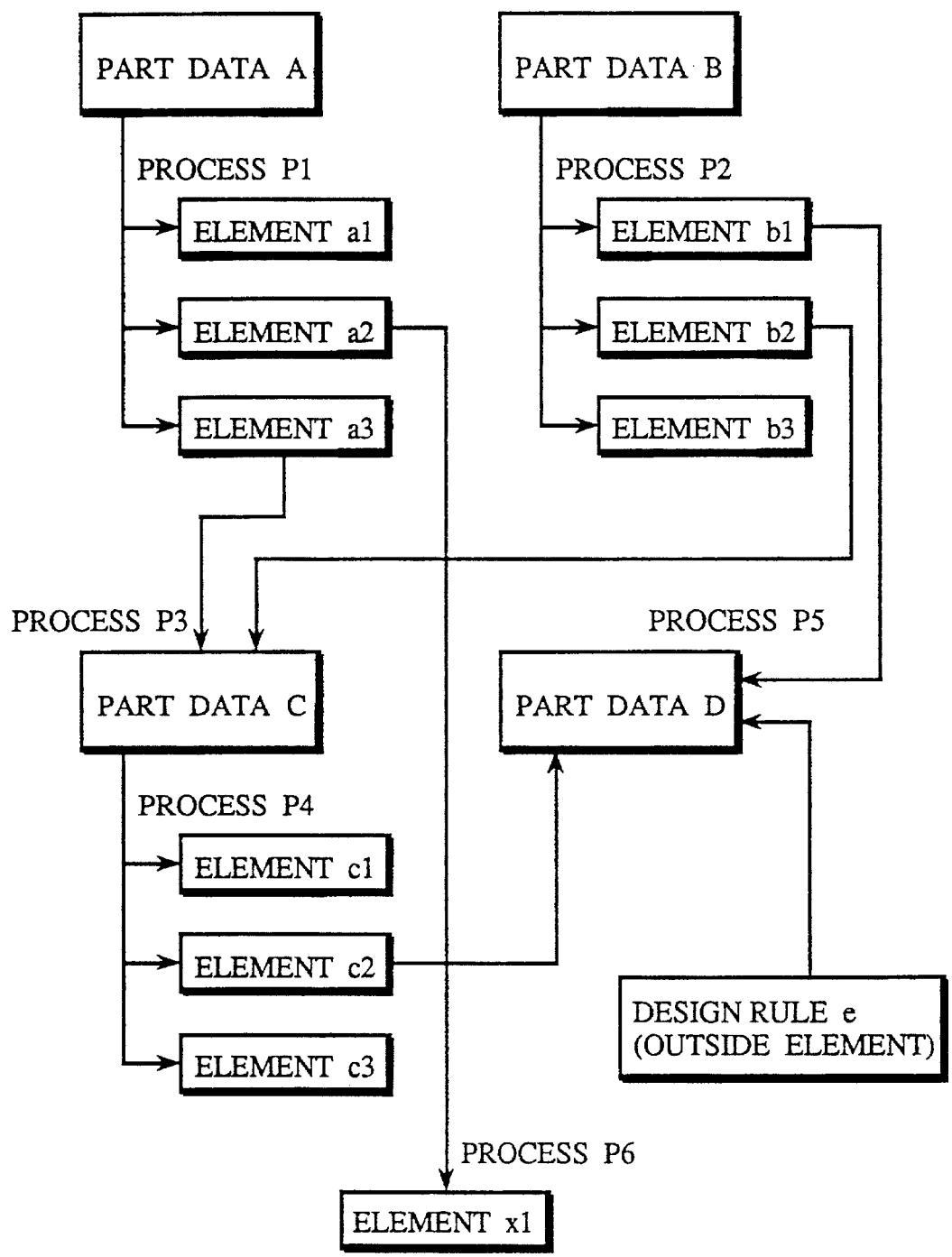
FIG. 5 is a view of a simplified model explaining interrelationships of LSI design part data.

Large amounts of LSI design part data are thus interrelated with one another. FIG. 5 is a simplified model as one example of such interrelationships. When the part data A is decomposed, elements a1, a2, a3 are extracted. When the part data B is decomposed, elements b1, b2, b3 are extracted. When the part data C is decomposed, elements c1, c2, c3 are extracted. The part data C is generated by synthesizing the elements a3, b2. The part data D is generated by synthesizing the elements b1, c2 and the design rule e added from the outside. This explains that part data used in the respective steps of FIG. 2 have complicated interrelationships with one another.

§4. LSI Design Part Data Generating Managing Function

Now referring back to FIG. 1, the operation of the device according to this invention will be explained. The element extracting means 20 has a function of extracting from selected part data a specific element included therein. That is, when the layout design data D of FIG. 4 is given, the element extracting means 20 extracts from the layout design part data D a functional element d1, a characteristic element d2 and a structural element d3. The means for conducting such processing per se is known. Specifically, as the means for extracting the functional element d1, various softwares for extracting circuit networks are known. As the means for extracting the characteristic element d2, various softwares for extracting electric parameters are known. As the means for extracting the structural element d3, various softwares for geometrical operations are known. The part synthesizing means 30 is a means characterizing this invention for synthesizing elements included in selected part data and/or elements added from the outside to generate new part data. For example, in FIG. 4, the element b1 included in the part data B, the element c2 included in the part data C, and the element e inputted from the outside are combined and new part data D is synthesized. Since LSI design part data includes, as described above, a functional element, a characteristic element and structural element, if these respective elements can be prepared, one part data normally can be generated by synthesizing these elements. The representation converting means 40 has a function of converting a representation of an element included in a selected part data to generate a different element. For example, an inverter is represented by the symbol mark of a triangle with a small circle attached to vertex, as a logic design part data. When the inverter is represented as circuit design part data, it is represented by a pair of parallelly connected transistors. When the inverter is represented as layout design part data, it is represented by a complicated graphic pattern. All of these representations show the same logic device of an inverter, which has the same function. The representation converting means 40 converts one representation to another representation concerning with the same part. The model of FIG. 5 shows an example in which a representation of the element a2 is converted to obtain an element x1. The means for converting a representation is also known, and various softwares are available. A characteristic of the device according to this invention is that a process for extracting an element by the element extracting means 20, a process for synthesizing parts by the part synthesizing means 30, and a process for converting a representation by the representation converting means 40 are respectively stored as process data. The memory means 10 in FIG. 1 has a part data region 11 and a process data region 12. Generated part data A, B, C, . . . , are stored in the part data region 11 and process data P1, P2, P3, . . . are stored in the process data region 12. The process data is indicative of information of a process how and what part or element was processed, and as a result what part or element was obtained. Specifically in the example of FIG. 4, when the functional element d1, the characteristic element d2 and the structural element d3 are obtained by conducting element extracting processing (decomposition) on the layout design part data D, information identifying softwares used in the respective element extracting processings are stored. For example, the information that "an extraction of the functional element on the part data D was conducted using a circuit network extracting software, and the element d1 was obtained" is stored as process data. In the embodiment of FIG. 4, the process data also contains information associated with the respective elements. For example, for the extraction process of the function element d1, the information that the element d1 is associated with the functional element b1 of the part data B is stored as process data. With respect to the process for extracting the structural element d3, the information that "the element d3 is associated with the design rule e" is stored as process data. Information indicative of such element relationships may be specified by an operator when the respective processes are executed or may be automatically generated by softwares for executing the respective processes.

The operation of the device of FIG. 1 on the model of FIG. 5 is as follows. The part data A and the part data B are stored beforehand in the part data region 11. Here it is assumed that using a specific software in the element extracting means 20, a process P1 in which the part data A was decomposed to extract the elements a1, a2, a3, and a process P2 in which the part data B was decomposed to extract the elements b1, b2, b3 were executed, and furthermore, using a specific software in the parts synthesizing means 30, a process P3 in which the element a3 and the element b2 were synthesized to generate the new part data C was executed. In this case, the new part data C is additionally stored in the part data region 11, while the process data P1, P2, P3 are stored in the process data region 12. Then it is assumed that using a specific software in the element extracting means 20, a process P4 in which the part data C was decomposed to extract the elements c1, c2, c3 was subsequently executed, and using a specific software in the part synthesizing means 30, a process P5 in which the elements b1, c2 and an external element e were synthesized to generate the new part data D was executed. In this case, the new part data D is additionally stored in the part data region 11, while the process data P4, P5 are stored in the process data region 12. A process P6 is further additionally stored in the process data region 12 if by using a specific software in the representation converting means 40, a representation of the element a2 is converted to obtain an element x1. Thus, when various processes are executed by the means of the device of FIG. 1, their processings are sequentially stored as process data in the process data region 12.

Next, advantages produced by storing such process data will be explained below. Semiconductor processes make progress day by day, and integration of devices formed on semiconductor wafers is yearly improved. Part data are accordingly revised suitably, and the so called updating of a version is conducted. For example, a technique by which insulation can be improved with a result that the gaps between wirings can be narrowed, design rules are updated, and as a result a layout design part data is updated to a next version. When the part data C in FIG. 3, for example, is versioned up, new part data CN indicative of the respective geometric figures which are smaller sized can be generated. The part data C and the part data CN are compared with each other by respective elements extracted therefrom. That is, the part data C and CN are the same in functional element (e.g., if the functional element is a mask pattern for an inverter device, even when a design rule is changed, the inverter device is still an inverter device). But the part data CN is different from the part data C in the characteristic element (e.g., operation times), and in the structure element (e.g., sizes, shapes, positions of input and output terminals). Then it is necessary to generate new part data based on these characteristic element and structural element. In such updating to a new version, the process data stored in the process data region 12 are very effective. That is, when content of one part or one element is updated to a new version, what influence this update to a new version will give other parts or elements can be easily informed based on the process data. In addition, update to a new version of the other parts and elements can be easily conducted based on the process data.

This will be explained by means of the model of FIG. 5. Here is assumed a case in which content of the part data A was updated to a new version due to a technical progress, and new part data AN was generated. In this case, when the process data P1 is read, the process data P1 contains the fact that the part data A was decomposed in the past into the elements a1, a2, a3. When the process data P3 is read, the process data P3 contains the fact that the elements a3 and the element b2 were synthesized into the part data C. Accordingly it can be known that when the element a3 is updated to a new version, the part data C as well has to be updated to a new version. For example, if the element a3 was updated to a new version to the element a3n since the part data A was updated to a new version to the part data AN, then it will be necessary to synthesize the element a3n and the element b2 to generate new part data CN. In other words, the update to a new version of the part data A to the part data AN makes it necessary to update to a new version the part data C to the part data CN. The device according to this invention can very easily conduct this update to a new version. This is because since the process data P3 is indicative of the past processing as to softwares used in synthesizing the elements a3 and b2 into the part data C, and synthesizing process for generating the part data C, the same process can be executed using the element a3n in place of the element a3, whereby updated to a new version part data CN can be automatically obtained.

When the part data C is updated to a new version to the part data CN, it can be easily examined whether or not content of the element c2 generated by executing a process P4 on the part data CN is changed. For example, when the element c2 is updated to a new version up to an element c2n, a process P5 is executed on the element c2n, the element b1 and the design rule e, whereby the part data D can be easily updated to a new version to the part data DN.

In short, by storing executed processes in the process data region 12, it can be automatically known which other part or element is influenced by update to a new version of one part or an element. Furthermore, the same process as in the past is again executed, whereby a part to be influenced by the updated to a new version can be automatically updated to a new version. Thus, in the device for managing LSI design part data of the present invention, respective processes executed on respective part data are stored as process data, so that data management including generation and revising part data can be easily conducted.

§5. Data Sheet Producing Mechanism

The function of generating and managing LSI design part data in the device of FIG. 2 has been explained in terms of its operation. The use of this function makes it easy to always keep the latest part data as a data base in the part data region 11. The device of FIG. 1 has, in addition to the unit of managing LSI design part data, sheet information generating means 60 and sheet producing means 70 so that data sheets can be displayed, printed and stored. The operation of producing a data sheet will be explained.

Here is discussed a case in which a user makes a specific ASIC design. The user wants various information of parts to be used in the design. The user conventionally selects necessary information in data books provided by semiconductor device makers. But the device according to this invention makes it easy for the user to obtain, by the following operation, data sheets carrying necessary information. First, the user supplies element designating information from the input means 50 to the element extracting means 20. The element designating information identifies an element of a part. For example, when information of the structural element d3, such as sizes, shapes, and input and output terminals in the layout design part data D in FIG. 4 is necessary, a command "the structural element d3 of the part data D is necessary" is employed. The element extracting means 20, in response to this command, extracts the structural element d3 from the part data D in the part data region 11. Here it is assumed that the mask pattern of FIG. 6 has been extracted as the structural element data d3.

Figure 6:
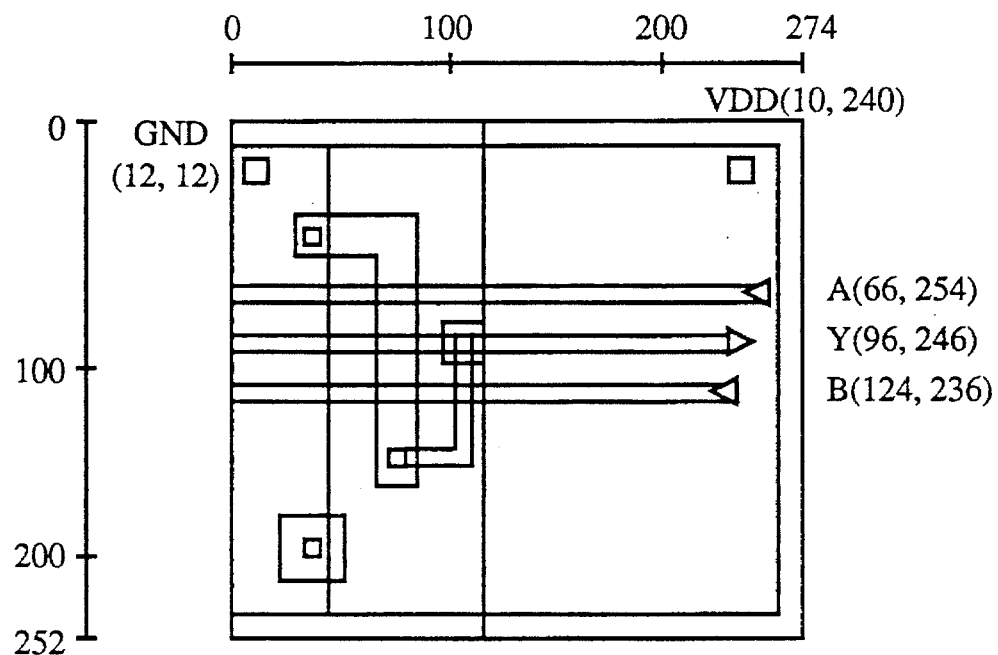
FIG. 6 is a view of mask pattern data extracted by the system of FIG. 1.
Figure 7:
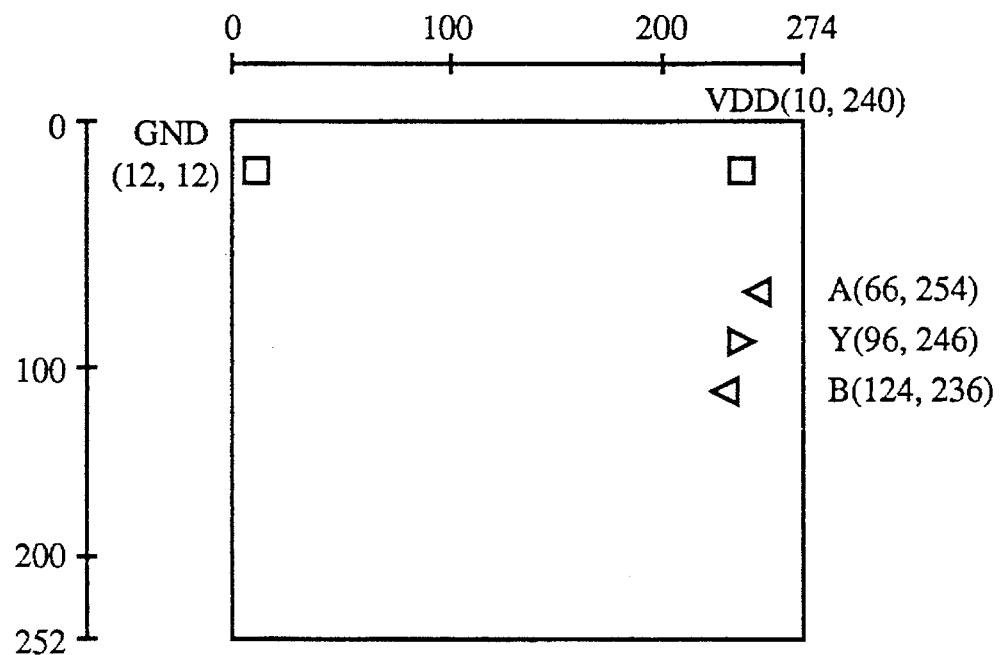
FIG. 7 is a view of a result of edited mask pattern data of FIG. 6.

The element data d3 extracted in this method is supplied to the sheet information generating means 60, where an editing operation of the data is conducted. The editing operation conducted here is roughly classified into two operations. A first operation is an editing of the extracted element data itself. This operation is for selecting out of the extracted data only that the user requires and picking out the required data alone. For example, in the mask pattern of FIG. 6, when only positions and names of input and output terminals are necessary, the user only gives the sheet information generating means 60, through the input means 50, information indicating to that effect as element editing information. Based on the element editing information, the sheet information generating means 60 selects only data the user requires out of the extracted element data. Specifically only data relating to positions and names of input and output terminals are selected out of the mask pattern data of FIG. 6, and the data of FIG. 7 is obtained. In such editing operation, a geometric figure operation is conducted for extracting information of only a specific layer out of the mask pattern data. A second operation conducted by the sheet information generating means 60 is for preparing an output of the element data in a set format. The user gives the sheet information generating means 60 through the input means 50 format setting information as to data to be produced, positions for the data to be produced, and formats for the data to be produced (for example, units of characteristic values, and a representation form, i.e., graphs or tables).

When the editing operation by the sheet information generating means 60 is over, edited data is supplied as sheet information to the sheet producing means 70. The sheet producing means 70 is provided specifically by a peripheral unit, such as a display, printer, hard disk device, magnetic tape device or others. When the edited information is displayed on the display, the user can see the information on the screen of the display, and when the edited information is printed by the printer, he can obtain a data sheet on which the information is printed out. When the edited information is stored on the hard disk device or magnetic tape device, the data sheet can be stored in digital data. FIG. 8 shows one example of the data sheets printed by the printer. The mask pattern data (only a part related to positions and names of input and output terminals) of FIG. 7 is produced in a region I of the data sheet. In a region II are produced symbols of kinds of the devices of the part. In a region III are produced a truth table. The symbols and the truth table of the devices can be obtained by extracting the functional element d1 from the part data D. In the regions IV and V, characteristic value information (relationship between a delay time T and an additional capacity) is produced. This characteristic value information is obtained by extracting the characteristic element d2 from the part data D. This characteristic value information is produced in a graphic form in the region IV and in a table in the region V. Such output forms are supplied to the sheet information generating means 60 as format setting information.

Thus by using the system according to this invention, required information stored in a data base in the part data region 11 can be produced as a data sheet in a required form. By using a process data in the process data region 12 it is possible to retrieve different part data related to one part data, and output a data sheet of the retrieved part data. For example, as shown in FIG. 5, the part data C can be retrieved as data related to the part data A by executing the process P1 on the part data A to obtain the element a3, executing the process P2 on the element data B to obtain the element b2, and executing the process P3 using the elements a3 and b2 to synthesize the part data C. Such retrieving operation is useful to select out of a number of parts those which will be actually used. For example, it is assumed that when a data sheet of a characteristic element (e.g., a delay time) of a part X which will be used is produced, it is found, in the data sheet, necessary to use a part having a shorter delay time. In this case, different parts Y, Z generated by using a functional element of the part X are retrieved using process data in the process data region 12. Since the parts X, Y, Z are parts generated based on the same functional element, their logic functions are equivalent. Then, by producing characteristic elements (delay times) of the retrieved parts Y, Z, an optimum part can be easily selected.

Thus, by using the data sheet producing mechanism of the system according to this invention, elements a user requires are selected out of LSI design part data prepared as databases, the extracted element data are edited into forms the user requires, and the element data can be produced in a data sheet. The information the user requires can be provided in a form the user requires.

§6. Function of Providing Libraries to CAD Tools

Figure 9:
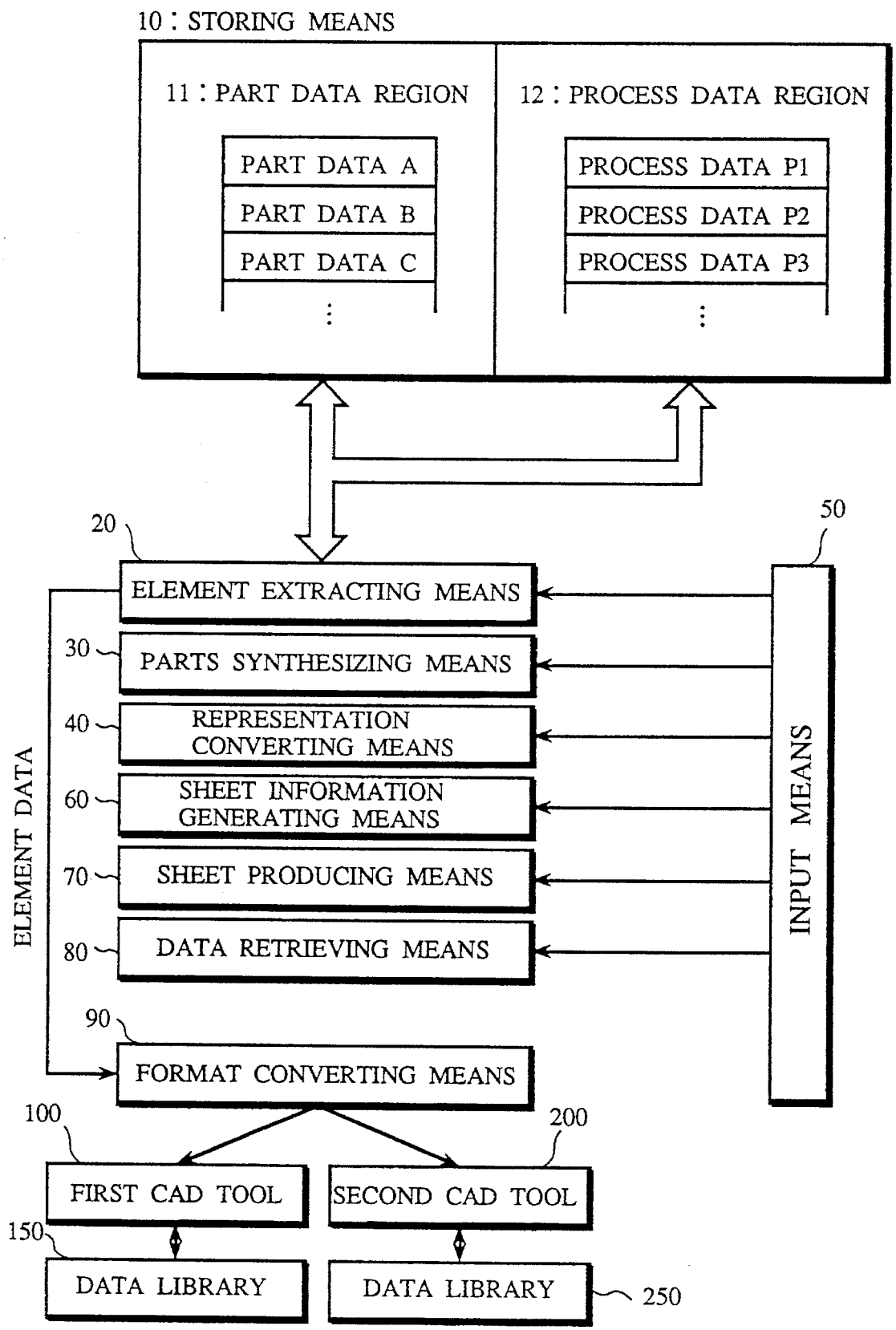
FIG. 9 is a block diagram of the system of FIG. 1 additionally including a function of providing libraries for CAD tools.

With reference to FIG. 9, an embodiment of the system according to this invention, comprising the system of FIG. 1 additionally having a function of providing CAD tools with libraries will be explained. In the embodiment of FIG. 9 the system according to the embodiment of FIG. 1 is connected to data retrieving means 80, and format converting means 90. Based on data bases prepared in the part data region 11, different data libraries 150, 250 can be provided respectively to CAD tools 100, 200. The function of providing libraries to the CAD tools will next be explained.

Here is considered a case where a user is making a specific ASIC design using a first CAD tool 100. In this case, the user uses those of a number of parts in the part data region which can be used by the first CAD tool to fabricate the specific ASIC. When it is assumed that the first CAD tool 100 is a tool for executing the layout design step 4 in FIG. 2, this tool uses the layout design part data. Then, the user supplies to the data retrieving means 80 from the input means 50 a retrieval command indicative of conditions of the layout design part data he is going to use in the first CAD tool. Based on this retrieval command, the data retrieving means 80 retrieves a part out of the data base in the part data region 11 which corresponds to the conditions. When the required part data is retrieved, the element extracting means 20 extracts necessary element data from the part data, and the extracted element data is supplied to the format converting means 90. The format converting means 90 has format information concerning the first CAD tool 100, and format information concerning the second CAD tool 200. In the above case, the format converting means 90 converts the extracted element data into a format agreeable with the first CAD tool 100 and supplies the converted data to the first CAD tool 100. Thus, the first CAD tool 100 can obtain required data in a required format, which can be stored as a data library 150.

The function of the format converting means 90 is to supply format data suitable to the respective CAD tools. Here it is assumed that the data of the mask pattern shown in FIG. 6 is extracted as element data, and this data is supplied to the format converting means 90. A CAD tool may require all the data of FIG. 6, and another CAD tool may require only positions and names of input and output terminals as shown in FIG.7. The same content of data may vary in structure depending on the respective CAD tools. In such cases, the format converting means 90 converts the data into formats suitable for the respective CAD tools and supplies the same. A characteristic of this invention is that databases in the part data region 11 are managed singly in a common format irrespective of which respective CAD tools are to be used and are converted by the format converting means 90 into formats suitable for the respective CAD tools to be employed. This arrangement permits part data to be revised the data only by revising in the part data region 11 in the database. When a new CAD tool is added, format information concerning the new CAD tool is merely added to format information in the format converting means 90, whereby a data library entry for the new CAD tool can be provided.

In the device according to this embodiment, the data retrieving means 80 can retrieve data using process data in the process data region 12. Here it is assumed that a user is making a logic design using the second CAD tool 200, and he uses various logic gates as parts in the logic design. For the convenience of explanation, it is assumed that the respective part data A to D of the model of FIG. 5 constitute part data groups each including multiple parts data. For example, a part data C-1 is synthesized by using an element a3-1 of part data A-1, and part data C-2 is synthesized by using an element a3-2 of part data A-2. Here it is assumed that the user requires to select logic gates having a specific power consumption out of the part data group C. When the elements a3-1, a3-2, . . . respectively indicate "power consumptions", the element a3-1, a3-2, . . . can be obtained for the respective part data C-1, C-2, . . . by referring to the respective processes P3-1, P3-2, . . . Then the element corresponding to the required power consumption is retrieved from the obtained elements a3-1, a3-2, . . . If the element a3-2 corresponds to the required power consumption, the part data C-2 is selected out of the part data group C. As described above, the parts in the part data region 11 are generated by complicated combination of the other part elements. Their generation processes are stored as process data in the process data region 12. By referring to the process data, a part having a specific "power consumption" can be easily retrieved. Thus, a characteristic of this invention is that, when a user specifies a required condition (e.g., "power consumption") as retrieval information, the data retrieving means 80 refers to the process data in the process data region 12 to retrieve a part agreeable with the condition.

Thus, relative to the function of the device according to this invention whereby libraries are provided for CAD tools, data required by a CAD tool is retrieved from a database based on retrieval information given from the CAD tool, and the data is subjected to format conversion in order to be agreeable with the CAD tool and is supplied thereto, whereby part data can be simply managed.

So far, this invention has been explained by means of embodiments using a simple model, but this invention is not limited to these embodiments and covers other various embodiments. For example, the means in FIGS. 1 and 9 may be provided by a single computer or by multiple computers. Alternatively, a part of the means can be installed at the site of a semiconductor device maker, the other part being installed at the site of a user, and both parts may be connected by a communication line. In the above described embodiments, though the treatment of an old updated version when an version is made is not referred to, in practice, it is possible to use the old version in designs so that it is preferred that both the old and the new versions are stored in the part data region 11. It is also possible that an element itself extracted by the element extracting means 20 is stored as one part data in the part data region 11.

Industrial Applicability

The system for managing LSI design part data of this invention is usable both by semiconductor device makers who provide design parts for designing LSIs, and by users who operate CAD tools using these design parts to design intended LSIs. This system is especially effective in designing ASICs.

We claim:

1. A system for managing LSI design part data to be used in LSI design, the system comprising:

part data storing means for storing each of function, logic, circuit, and layout type design, part data, each of which includes elements, said elements including a functional element which defines a function of a device derived from the part data, a characteristic element which defines characteristic values of said device and a structural element which defines a physical structure of said device;

means for selecting data from the thusly, stored part data;

element extracting means for effecting an extraction process for extracting, from any one or more of the thusly selected part data which is inclusive of function, logic, circuit, and layout design part data, a specific element included in the selected part data;

part synthesizing means for effecting a synthesis process for synthesizing a part by combining elements extracted by said element extracting means to generate new part data or by combining at least one element extracted by the element extracting means and an element input to said system to generate new part data, said part synthesizing means storing the thusly generated new part data in said part data storing means;

process data storing means for storing extraction process data when an extraction process is effected by said element extraction means and for storing synthesis process data when a synthesis is effected by said part synthesizing means, said extraction process data specifying the extraction process, selected part data from which the extraction is effected and an extracted element, is to be extracted and said synthesis process data specifying the synthesis process, elements to be synthesized and the thusly generated new part data; and input means for providing instruction information to said element extracting means and said part synthesizing means.

2. A system for managing LSI design part data to be used in LSI design according to claim 1, said system further comprising:

representation converting means for converting a representation of an element of selected part data to generate a different element by use of a process of representation conversion by said representation converting means which is stored in the process data storing means.

3. A system for managing LSI design part data to be used in LSI design according to claim 1, said system further comprising:

sheet information generating means for editing data corresponding to an element extracted by the element extracting means, based on set information, whereby to generate sheet information; and sheet producing means for producing a data sheet, based on said sheet information;

wherein the input means inputs an instruction for identifying an element to be extracted into the element extracting means and inputs an instruction for identifying an editing to be conducted and a format of the sheet information to be formed into the sheet information generating means.

4. A system for managing LSI design part data to be used in LSI design according to claim 2, said system further comprising:

sheet information generating means for editing data corresponding to an element extracted by the element extracting means, based on set information, whereby to generate sheet information; and sheet producing means for producing a data sheet, based on said sheet information;

wherein the input means inputs an instruction for identifying an element to be extracted into the element extracting means and inputs an instruction for identifying an editing to be conducted and a format of the sheet information to be formed into the sheet information generating means.

5. A system for managing LSI design part data to be used in LSI design according to claim 1, said system further comprising:

data retrieving means for retrieving specific data from the part data storing means, based on a retrieval command supplied to said system; and format converting means for converting a format of the specific data retrieved by said data retrieving means to agree with a format corresponding to a CAD tool;

wherein the input means inputs an instruction indicating the retrieval command into the data retrieving means.

6. A system for managing LSI design part data to be used in LSI design according to claim 2, said system further comprising:

data retrieving means for retrieving specific data from the part data storing means, based on a retrieval command supplied to said system; and format converting means for converting a format of the specific data retrieved by said data retrieving means to agree with a format corresponding to a CAD tool;

wherein the input means inputs an instruction indicating the retrieval command into the data retrieving means.

7. A system for managing LSI design part data to be used in LSI design according to claim 3, said system further comprising:

data retrieving means for retrieving specific data from the part data storing means, based on a retrieval command supplied to said system; and format converting means for converting a format of the specific data retrieved by said data retrieving means to agree with a format corresponding to a CAD tool;

wherein the input means inputs an instruction indicating the retrieval command into the data retrieving means.

8. A system for managing LSI design part data to be used in LSI design according to claim 4, said system further comprising:

data retrieving means for retrieving specific data from the part data storing means, based on a retrieval command supplied to said system; and format converting means for converting a format of the specific data retrieved by said data retrieving means to agree with a format corresponding to a CAD tool;

wherein the input means inputs an instruction indicating the retrieval command into the data retrieving means.

* * * * *